US008509351B1

(12) United States Patent
Khlat et al.

(10) Patent No.: US 8,509,351 B1
(45) Date of Patent: Aug. 13, 2013

(54) MULTI-MODE RADIO FREQUENCY MODULATION CIRCUITRY

(75) Inventors: Nadim Khlat, Cugnaux (FR); Alexander Wayne Hietala, Phoenix, AZ (US); Marcus Granger-Jones, Scotts Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 329 days.

(21) Appl. No.: 12/895,223

(22) Filed: Sep. 30, 2010

Related U.S. Application Data

(60) Provisional application No. 61/247,283, filed on Sep. 30, 2009.

(51) Int. Cl.
*H03C 3/00* (2006.01)
(52) U.S. Cl.
USPC ........... 375/302; 370/207; 370/483; 375/223; 375/271; 455/110
(58) Field of Classification Search
None
See application file for complete search history.

(56) References Cited

U.S. PATENT DOCUMENTS 8,059,748 B2 * 11/2011 See et al. ................. 375/296

OTHER PUBLICATIONS

Mehta, J. et al., "A 0.8mm2 all-digital SAW-less polar transmitter in 65nm EDGE SoC," 2010 IEEE International Solid-State Circuits Conference Digest of Technical Papers, Feb. 7-11, 2010, pp. 58-59, IEEE.
Razavi, B., "RF transmitter architectures and circuits," Proceedings of the IEEE 1999 Custom Integrated Circuits, 1999, pp. 197-204, IEEE.

* cited by examiner

*Primary Examiner* — Adolf Dsouza
(74) *Attorney, Agent, or Firm* — Withrow & Terranova, P.L.L.C.

(57) ABSTRACT

The present disclosure relates to multi-mode RF circuitry using a single IQ modulator topology that may support different communication standards, including enhanced data rates for global system for mobile communications evolution (EDGE) and EDGE evolution by dividing certain modulation functions between a frequency synthesizer and an IQ modulator. Specifically, during a standard modulation mode, which may be used to support many communications standards, the frequency synthesizer provides an un-modulated RF carrier signal to the IQ modulator, which either phase modulates or phase and amplitude modulates the un-modulated RF carrier signal to provide a standard modulated RF signal. During a small signal polar modulation mode, which may be used to support the EDGE and EDGE evolution protocols, the frequency synthesizer provides a phase-modulated RF carrier signal to the IQ modulator, which may or may not amplitude modulate the phase-modulated RF carrier signal to provide a small signal polar modulated RF signal.

24 Claims, 9 Drawing Sheets

MULTI-MODE RADIO FREQUENCY MODULATION CIRCUITRY

This application claims the benefit of provisional patent application Ser. No. 61/247,283, filed Sep. 30, 2009, the disclosure of which is hereby incorporated herein by reference in its entirety.

FIELD OF THE DISCLOSURE

Embodiments of the present disclosure relate to radio frequency (RF) modulators, which may be used in RF communications systems.

BACKGROUND OF THE DISCLOSURE

As wireless communications technologies evolve, wireless communications systems become increasingly sophisticated. Multi-mode and multi-band wireless systems are routinely available. Such systems may include common circuit elements to support multiple modes, multiple bands, or both. Such common circuit elements may include a front-end transmitter, a front-end receiver, a transceiver integrated circuit (IC), and the like. The transceiver IC may include RF modulation circuitry to provide several different types of modulation for RF transmit signals. Examples of modulated RF transmit signals that support different communications standards include wideband code division multiple access (WCDMA) transmit signals, time division synchronous code division multiple access (TD-SCDMA) transmit signals, long term evolution (LTE) transmit signals, global system for mobile communications (GSM) transmit signals, enhanced data rates for GSM evolution (EDGE) transmit signals, and EDGE evolution transmit signals. Such transmit signals may include amplitude and phase modulated transmit signals. As such, a traditional linear IQ modulator may be sufficient to provide modulation and up-conversion functions to create the amplitude and phase modulated transmit signals for most of these communications standards. However, certain EDGE and EDGE evolution transmit signals, particularly low band EDGE and EDGE evolution transmit signals, may have stringent noise requirements in an accompanying receive band. For example, a receive frequency may be offset 20 megahertz (MHz) from a transmit frequency and the receive band may have a maximum allowable noise level of −79 decibel milliwatts (dBm) in a 100 kilohertz (KHz) bandwidth. To meet such a noise requirement, the transmitter's IQ modulator would need to have a noise level of less than −166 decibel carrier (dBc) per hertz (Hz), which may be difficult. As a result, many multi-mode RF transmitters may have two separate IQ modulator topologies to meet the noise requirements imposed by EDGE and EDGE evolution. Two separate IQ modulator topologies increases space and cost of a multi-mode system. Thus, there is a need for a single IQ modulator topology that can support different communication standards, including EDGE and EDGE evolution, while meeting noise requirements.

SUMMARY OF THE EMBODIMENTS

The present disclosure relates to multi-mode RF circuitry using a single IQ modulator topology that may support different communication standards, including enhanced data rates for global system for mobile communications evolution (EDGE) and EDGE evolution by dividing certain modulation functions between a frequency synthesizer and an IQ modulator. Specifically, during a standard modulation mode, which may be used to support many communications standards, the frequency synthesizer provides an un-modulated RF carrier signal to the IQ modulator, which either phase modulates or phase and amplitude modulates the un-modulated RF carrier signal to provide a standard modulated RF signal. This method of modulation can support wide bandwidths of the modulating signal but typically does not provide superior noise performance. Thus, this method may be used for WCDMA and LTE standards.

During a small signal polar modulation mode, which may be used to support the EDGE and EDGE evolution protocols, the frequency synthesizer provides a phase-modulated RF carrier signal to the IQ modulator, which may or may not amplitude modulate the phase-modulated RF carrier signal to provide a small signal polar modulated RF signal. By dividing phase modulation and amplitude modulation between the frequency synthesizer and the IQ modulator instead of performing both phase and amplitude modulation within the IQ modulator, the stringent noise requirements of the EDGE and EDGE evolution protocols may be easier to meet.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to multi-mode RF circuitry using a single IQ modulator topology that may support different communication standards, including enhanced data rates for global system for mobile communications evolution (EDGE) and EDGE evolution by dividing certain modulation functions between a frequency synthesizer and an IQ modulator. Specifically, during a standard modulation mode, which may be used to support many communications standards, the frequency synthesizer provides an un-modulated RF carrier signal to the IQ modulator, which either phase modulates or phase and amplitude modulates the un-modulated RF carrier signal to provide a standard modulated RF signal.

During a small signal polar modulation mode, which may be used to support the EDGE and EDGE evolution protocols, the frequency synthesizer provides a phase-modulated RF carrier signal to the IQ modulator, which may or may not amplitude modulate the phase-modulated RF carrier signal to provide a small signal polar modulated RF signal. By dividing phase modulation and amplitude modulation between the frequency synthesizer and the IQ modulator instead of performing both phase and amplitude modulation within the IQ modulator, the stringent noise requirements of the EDGE and EDGE evolution protocols may be easier to meet. As such, a single transmit chain may be used to support all of the communications protocols. Using a single transmit chain may reduce size and cost, and may reduce or eliminate the number of RF switches needed, which may further reduce size, cost, and insertion loss.

Figure 1:
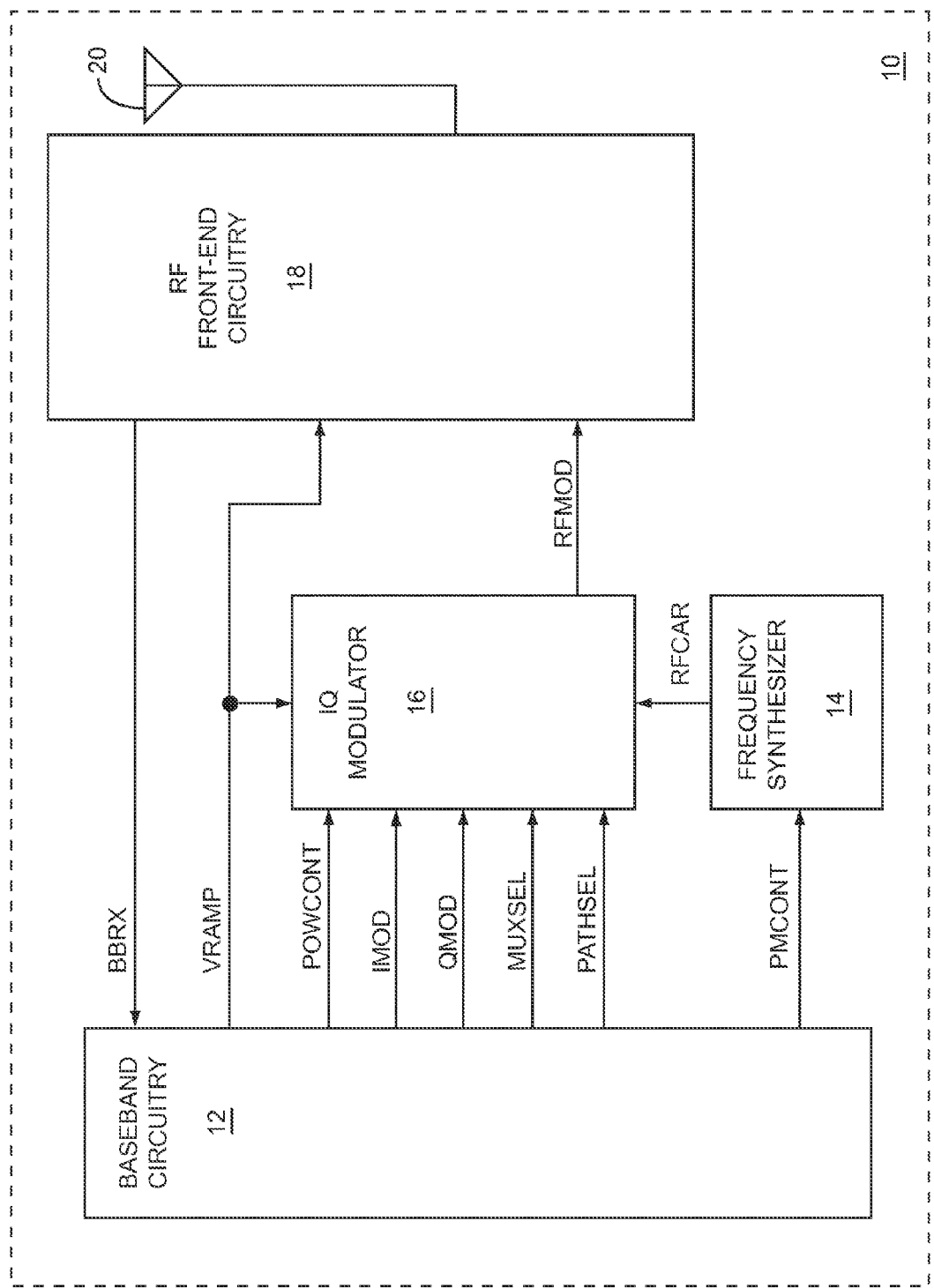
FIG. 1 shows multi-mode RF circuitry according to one embodiment of the multi-mode RF circuitry.

FIG. 1 shows multi-mode RF circuitry 10 according to one embodiment of the multi-mode RF circuitry 10. The multi-mode RF circuitry 10 includes baseband circuitry 12, a frequency synthesizer 14, an IQ modulator 16, RF front-end circuitry 18, and an antenna 20. The RF front-end circuitry 18 is coupled to the antenna 20. The RF front-end circuitry 18 may provide a baseband receive signal BBRX to the baseband circuitry 12 based on receiving and down-converting a received RF signal via the antenna 20. The baseband circuitry 12 may provide a transmit power ramp signal VRAMP to the IQ modulator 16 and to the RF front-end circuitry 18. The baseband circuitry 12 may provide a transmit power control signal POWCONT, an in-phase modulation signal IMOD, a quadrature-phase modulation signal QMOD, a multiplexer select signal MUXSEL, and a path select signal PATHSEL to the IQ modulator 16. The IQ modulator 16 provides a modulated RF signal RFMOD to the RF front-end circuitry 18. Further, the baseband circuitry 12 may provide a phase modulation control signal PMCONT to the frequency synthesizer 14, which provides an RF carrier signal RFCAR to the IQ modulator 16.

Figure 2:
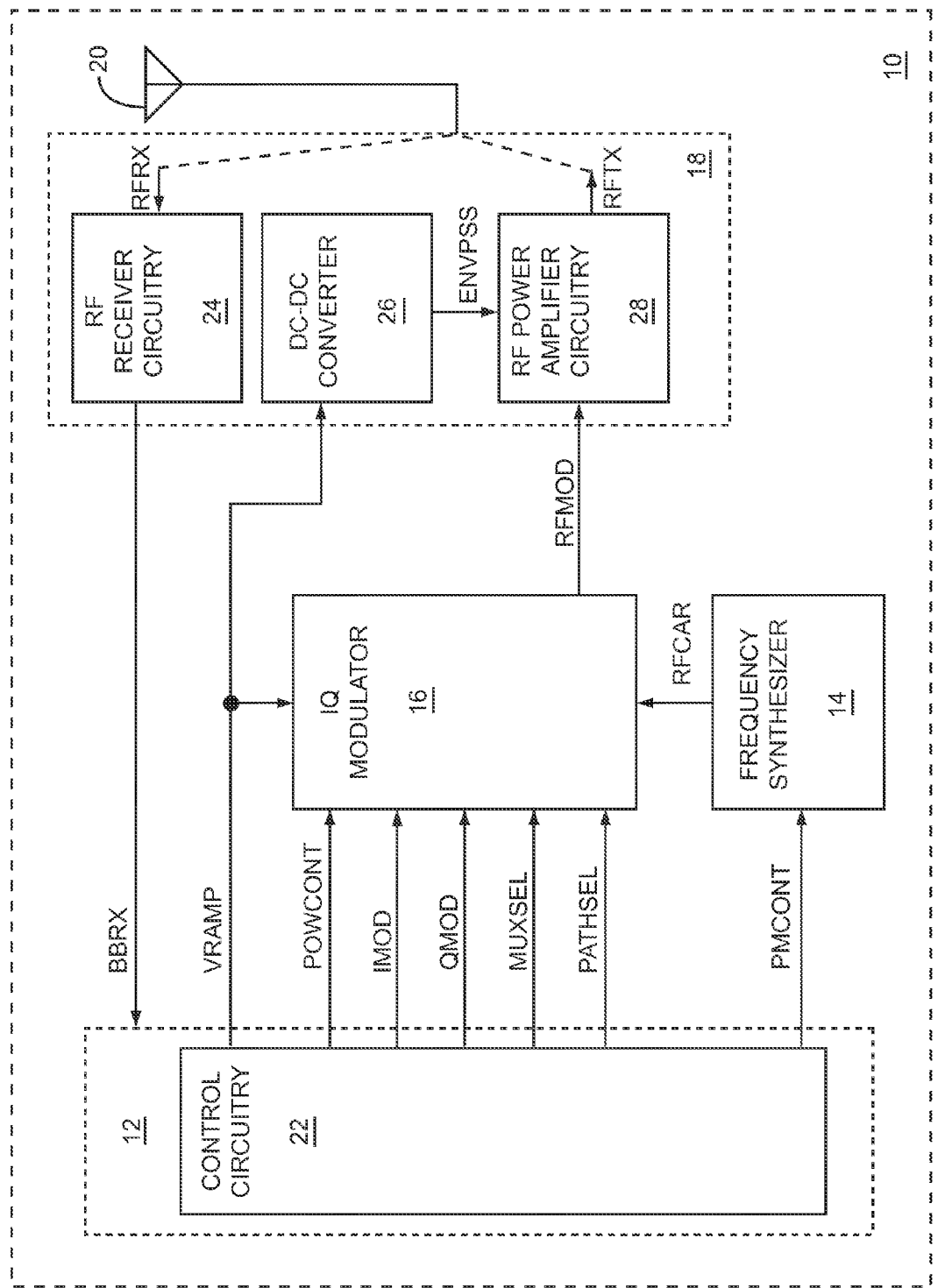
FIG. 2 shows details of baseband circuitry and RF front-end circuitry illustrated in FIG. 1 according to one embodiment of the baseband circuitry and the RF front-end circuitry.

FIG. 2 shows details of the baseband circuitry 12 and the RF front-end circuitry 18 illustrated in FIG. 1 according to one embodiment of the baseband circuitry 12 and the RF front-end circuitry 18. The baseband circuitry 12 includes control circuitry 22 and the RF front-end circuitry 18 includes RF receiver circuitry 24, a direct current (DC)-DC converter 26, and RF power amplifier circuitry 28. The RF receiver circuitry 24 may receive and down-convert an RF receive signal RFRX from the antenna 20 to provide the baseband receive signal BBRX to the baseband circuitry 12. The control circuitry 22 may provide the transmit power ramp signal VRAMP to the IQ modulator 16 and to the DC-DC converter 26. The control circuitry 22 may provide the transmit power control signal POWCONT, the in-phase modulation signal IMOD, the quadrature-phase modulation signal QMOD, the multiplexer select signal MUXSEL, and the path select signal PATHSEL to the IQ modulator 16. The IQ modulator 16 provides the modulated RF signal RFMOD to the RF power amplifier circuitry 28. Further, the control circuitry 22 may provide the phase modulation control signal PMCONT to the frequency synthesizer 14, which provides the RF carrier signal RFCAR to the IQ modulator 16.

In general, the IQ modulator 16 modulates the RF carrier signal RFCAR to provide the modulated RF signal RFMOD to the RF power amplifier circuitry 28, which receives and amplifies the modulated RF signal RFMOD to provide an RF transmit signal RFTX to the antenna 20 for transmission. The DC-DC converter 26 provides an envelope power supply signal ENVPSS to the RF power amplifier circuitry 28 to provide power for amplification. The envelope power supply signal ENVPSS is based on the transmit power ramp signal VRAMP. In one mode of operation, the transmit power ramp signal VRAMP may track an amplitude ramp profile to cause the envelope power supply signal ENVPSS to track the amplitude ramp profile.

In one embodiment of the control circuitry 22, during operation, the control circuitry 22 selects between a standard modulation mode and a small signal polar modulation mode. The small signal polar modulation mode may be used to support EDGE and EDGE evolution protocols, whereas the standard modulation mode may be used to support the balance of the communications protocols provided by the multi-mode RF circuitry 10. In one embodiment of the frequency synthesizer 14 and the control circuitry 22, during the standard modulation mode, the RF carrier signal RFCAR is an un-modulated RF carrier signal, and during the small signal polar modulation mode, the RF carrier signal RFCAR is a phase-modulated RF carrier signal, such that the phase modulation of the phase-modulated RF carrier signal is based on the phase modulation control signal PMCONT, which is provided by the control circuitry 22.

In one embodiment of the IQ modulator 16 and the control circuitry 22, during the standard modulation mode, the IQ modulator 16 receives the in-phase modulation signal IMOD and the quadrature-phase modulation signal QMOD from the control circuitry 22, such that the in-phase modulation signal IMOD and the quadrature-phase modulation signal QMOD include phase information. Further, during the standard modulation mode, the IQ modulator 16 receives and phase-modulates the un-modulated RF carrier signal using the phase information to provide the modulated RF signal RFMOD, which during the standard modulation mode is a standard modulated RF signal.

Additionally, during the small signal polar modulation mode, the IQ modulator 16 receives the in-phase modulation signal IMOD, the quadrature-phase modulation signal QMOD, or both from the control circuitry 22, such that the in-phase modulation signal IMOD, the quadrature-phase modulation signal QMOD, or both includes amplitude information. The amplitude information may include amplitude modulation information or may exclude amplitude modulation information. Further, during the small signal polar modulation mode, the IQ modulator 16 receives the phase-modulated RF carrier signal and uses the amplitude information to provide the modulated RF signal RFMOD, which during the small signal polar modulation mode is a small signal polar modulated RF signal. The small signal polar modulated RF signal may be an EDGE transmit signal or may be an EDGE evolution transmit signal.

In one embodiment of the RF power amplifier circuitry 28, during the standard modulation mode, the RF power amplifier circuitry 28 receives and amplifies the standard modulated RF signal to provide the RF transmit signal RFTX, and during the small signal polar modulation mode, the RF power amplifier circuitry 28 receives and amplifies the small signal polar modulated RF signal to provide the RF transmit signal RFTX.

In one embodiment of the IQ modulator 16 and the control circuitry 22, during the standard modulation mode, the IQ modulator 16 receives the in-phase modulation signal IMOD and the quadrature-phase modulation signal QMOD from the control circuitry 22, such that the in-phase modulation signal IMOD and the quadrature-phase modulation signal QMOD include phase information and amplitude. Further, during the standard modulation mode, the IQ modulator 16 receives, phase-modulates and amplitude modulates the un-modulated RF carrier signal using the phase information and the amplitude information to provide the modulated RF signal RFMOD, which during the standard modulation mode is a standard modulated RF signal, such that the RF transmit signal RFTX is amplitude and phase modulated.

In one embodiment of the DC-DC converter 26, during the standard modulation mode, the DC-DC converter 26 provides power for amplification to the RF power amplifier circuitry 28 via the envelope power supply signal ENVPSS, such that the envelope power supply signal ENVPSS tracks the amplitude modulation present on the modulated RF signal RFMOD.

In an alternate embodiment of the DC-DC converter 26, during the standard modulation mode, the DC-DC converter 26 provides power for amplification to the RF power amplifier circuitry 28 via the envelope power supply signal ENVPSS, such that the envelope power supply signal ENVPSS is a constant value.

In one embodiment of the IQ modulator 16, during the small signal polar modulation mode, the IQ modulator 16 receives the in-phase modulation signal IMOD, the quadrature-phase modulation signal QMOD, or both from the control circuitry 22, such that the in-phase modulation signal IMOD, the quadrature-phase modulation signal QMOD, or both includes the amplitude information. Further, during the small signal polar modulation mode, the IQ modulator 16 receives and amplitude modulates the phase-modulated RF carrier signal using the amplitude information to provide the modulated RF signal RFMOD, which during the small signal polar modulation mode is a small signal polar modulated RF signal, such that the RF transmit signal RFTX is amplitude and phase modulated and neither the in-phase modulation signal IMOD nor the quadrature-phase modulation signal QMOD includes phase modulation information.

In one embodiment of the DC-DC converter 26, during the small signal polar modulation mode, the DC-DC converter 26 provides power for amplification to the RF power amplifier circuitry 28 via the envelope power supply signal ENVPSS, such that the envelope power supply signal ENVPSS tracks the amplitude modulation present on the modulated RF signal RFMOD.

In an alternate embodiment of the DC-DC converter 26, during the small signal polar modulation mode, the DC-DC converter 26 provides power for amplification to the RF power amplifier circuitry 28 via the envelope power supply signal ENVPSS, such that the envelope power supply signal ENVPSS is a constant value.

In one embodiment of the IQ modulator 16, during the small signal polar modulation mode, the IQ modulator 16 receives the in-phase modulation signal IMOD, the quadrature-phase modulation signal QMOD, or both from the control circuitry 22, such that the in-phase modulation signal IMOD, the quadrature-phase modulation signal QMOD, or both includes the amplitude information. In the embodiment presented, the amplitude information consists of control ramp information and excludes amplitude modulation information. Further, during the small signal polar modulation mode, the IQ modulator 16 receives the phase-modulated RF carrier signal and uses the amplitude information to provide the modulated RF signal RFMOD, which during the small signal polar modulation mode is a small signal polar modulated RF signal, such that the small signal polar modulated RF signal is not amplitude modulated, the RF transmit signal RFTX is not amplitude modulated, and neither the in-phase modulation signal IMOD nor the quadrature-phase modulation signal QMOD includes phase modulation information. During the small signal polar modulation mode, the RF transmit signal RFTX may be a Gaussian Minimum Shift Keying (GMSK) RF transmit signal.

In one embodiment of the DC-DC converter 26, during the small signal polar modulation mode, the DC-DC converter 26 provides power for amplification to the RF power amplifier circuitry 28 via the envelope power supply signal ENVPSS, such that the envelope power supply signal ENVPSS is not amplitude modulated and the RF transmit signal RFTX is not amplitude modulated. In a first exemplary embodiment of the DC-DC converter 26, during the small signal polar modulation mode, both the envelope power supply signal ENVPSS and the amplitude information track an amplitude ramp profile. In a second exemplary embodiment of the DC-DC converter 26, during the small signal polar modulation mode, the envelope power supply signal ENVPSS does not track the amplitude ramp profile and the amplitude information tracks the amplitude ramp profile.

Figure 3:
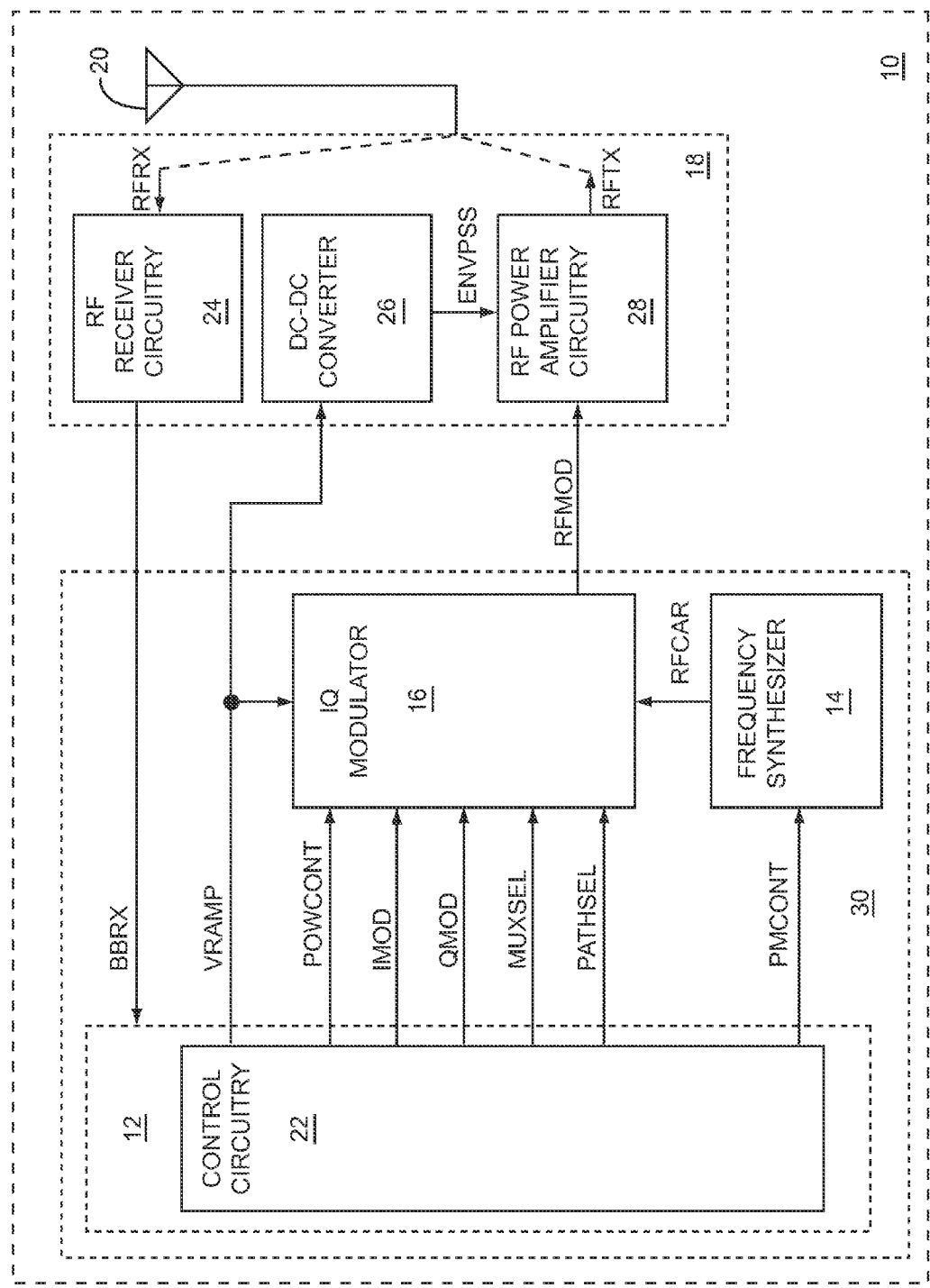
FIG. 3 shows the multi-mode RF circuitry according to an alternate embodiment of the multi-mode RF circuitry.

FIG. 3 shows the multi-mode RF circuitry 10 according to an alternate embodiment of the multi-mode RF circuitry 10. The multi-mode RF circuitry 10 shown in FIG. 3 is similar to the multi-mode RF circuitry 10 illustrated in FIG. 2, except in the multi-mode RF circuitry 10 illustrated in FIG. 3, the multi-mode RF circuitry 10 includes a transceiver IC 30, which includes the baseband circuitry 12, the frequency synthesizer 14, and the IQ modulator 16. In the embodiment shown, the transceiver IC 30 receives the baseband receive signal BBRX. In an alternate embodiment (not shown) of the transceiver IC 30, the transceiver IC 30 may down-convert the RF receive signal RFRX to provide the baseband receive signal BBRX. In another embodiment (not shown) of the multi-mode RF circuitry 10, the multi-mode RF circuitry 10 excludes the RF front-end circuitry 18.

Figure 4:
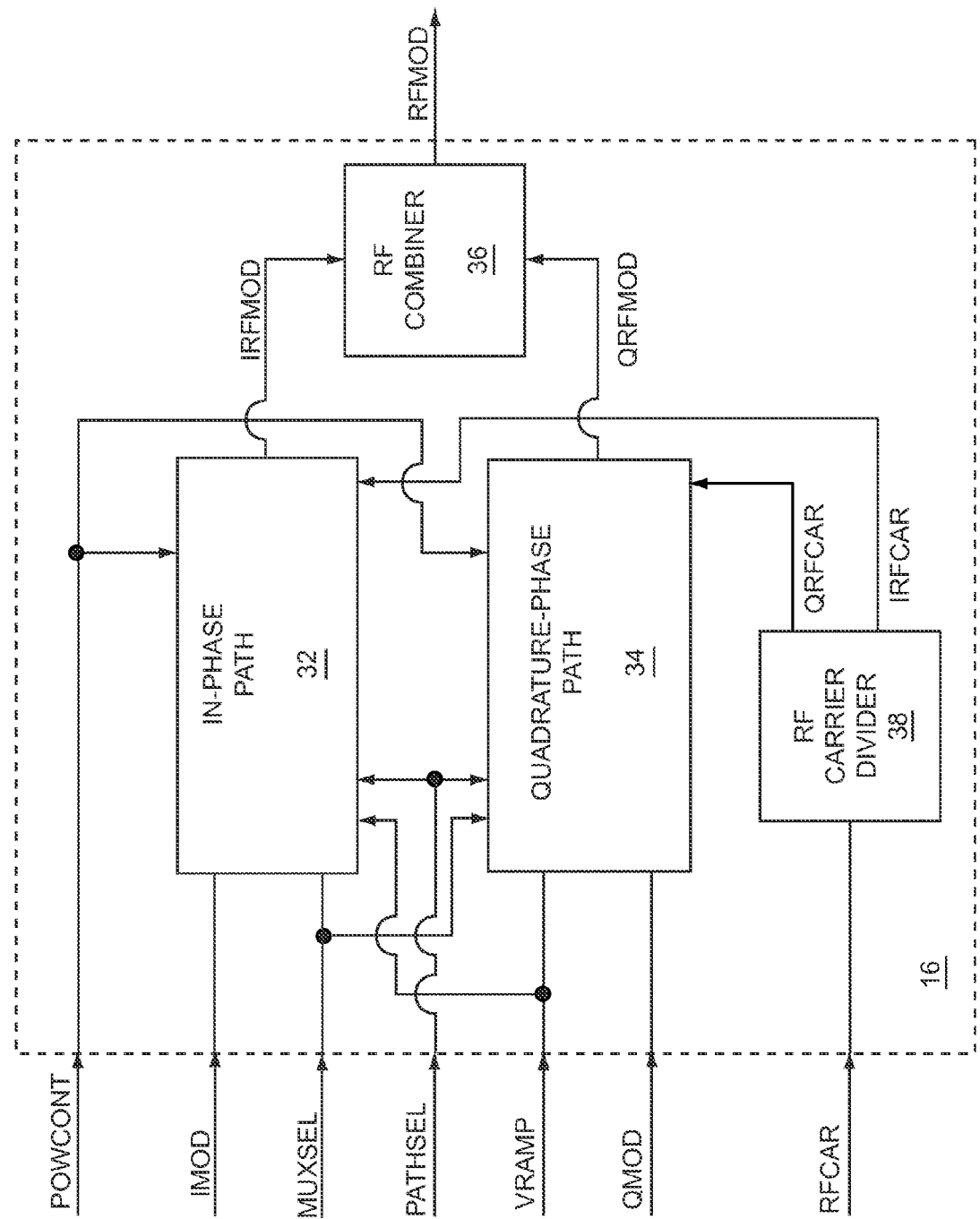
FIG. 4 shows details of an IQ modulator illustrated in FIG. 1 according to one embodiment of the IQ modulator.

FIG. 4 shows details of the IQ modulator 16 illustrated in FIG. 1 according to one embodiment of the IQ modulator 16. The IQ modulator 16 includes an in-phase path 32, a quadrature-phase path 34, an RF combiner 36, and an RF carrier divider 38. The in-phase path 32 receives the transmit power ramp signal VRAMP, the transmit power control signal POWCONT, the path select signal PATHSEL, and the multiplexer select signal MUXSEL. The quadrature-phase path 34 receives the transmit power ramp signal VRAMP, the transmit power control signal POWCONT, the path select signal PATHSEL, and the multiplexer select signal MUXSEL. The path select signal PATHSEL may be used to disable either the in-phase path 32, the quadrature-phase path 34, or both.

In general, the RF carrier divider 38 receives, divides, and splits the RF carrier signal RFCAR into an in-phase RF carrier signal IRFCAR and a quadrature-phase RF carrier signal QRFCAR, such that the quadrature-phase RF carrier signal QRFCAR is phase-shifted from the in-phase RF carrier signal IRFCAR by about 90 degrees. In one embodiment of the RF carrier divider 38, a frequency of the RF carrier signal RFCAR is equal to two times a frequency of the in-phase RF carrier signal IRFCAR and the quadrature-phase RF carrier signal QRFCAR. In this embodiment, the RF transmit signal RFTX may be a high band signal. In an alternate embodiment of the RF carrier divider 38, a frequency of the RF carrier signal RFCAR is equal to four times a frequency of the in-phase RF carrier signal IRFCAR and the quadrature-phase RF carrier signal QRFCAR. In this embodiment, the RF transmit signal RFTX may be a low band signal.

In one embodiment of the RF carrier divider 38, during the standard modulation mode, the RF carrier divider 38 receives and divides the un-modulated RF carrier signal to provide the in-phase RF carrier signal IRFCAR, which is an un-modulated in-phase RF carrier signal, and the quadrature-phase RF carrier signal QRFCAR, which is an un-modulated quadrature-phase RF carrier signal, such that the un-modulated quadrature-phase RF carrier signal is phase-shifted from the un-modulated in-phase RF carrier signal by about 90 degrees.

In one embodiment of the RF carrier divider 38, during the small signal polar modulation mode, the RF carrier divider 38 receives and divides the phase-modulated RF carrier signal to provide the in-phase RF carrier signal IRFCAR, which is a phase-modulated in-phase RF carrier signal, and the quadrature-phase RF carrier signal QRFCAR, which is a phase-modulated quadrature-phase RF carrier signal, such that the phase-modulated quadrature-phase RF carrier signal is phase-shifted from the phase-modulated in-phase RF carrier signal by about 90 degrees.

In one embodiment of the in-phase path 32, during the standard modulation mode, the in-phase path 32 receives the in-phase RF carrier signal IRFCAR, which is an un-modulated in-phase RF carrier signal, and receives the in-phase modulation signal IMOD. Further, during the standard modulation mode, the in-phase path 32 phase-modulates the un-modulated in-phase RF carrier signal to provide an in-phase modulated RF signal IRFMOD, which during the standard modulation mode is an in-phase standard modulated RF signal. During the small signal polar modulation mode, the in-phase path 32 receives the in-phase RF carrier signal IRFCAR, which is a phase-modulated in-phase RF carrier signal, and receives the in-phase modulation signal IMOD. Further, during the small signal polar modulation mode, the in-phase path 32 uses the amplitude information to provide the in-phase modulated RF signal IRFMOD, which during the small signal polar modulation mode is an in-phase small signal polar modulated RF signal, based on the phase-modulated in-phase RF carrier signal.

In an alternate embodiment of the in-phase path 32, during the small signal polar modulation mode, the in-phase path 32 is disabled. As a result, the in-phase modulated RF signal IRFMOD is not active. Further, during the small signal polar modulation mode, at least part of the in-phase path 32 may be powered down.

In one embodiment of the quadrature-phase path 34, during the standard modulation mode, the quadrature-phase path 34 receives the quadrature-phase RF carrier signal QRFCAR, which is an un-modulated quadrature-phase RF carrier signal, and receives the quadrature-phase modulation signal QMOD. Further, during the standard modulation mode, the quadrature-phase path 34 phase-modulates the un-modulated quadrature-phase RF carrier signal to provide a quadrature-phase modulated RF signal QRFMOD, which during the standard modulation mode is a quadrature-phase standard modulated RF signal. During the small signal polar modulation mode, the quadrature-phase path 34 receives the quadrature-phase RF carrier signal QRFCAR, which is a phase-modulated quadrature-phase RF carrier signal, and receives the quadrature-phase modulation signal QMOD. Further, during the small signal polar modulation mode, the quadrature-phase path 34 uses the amplitude information to provide the quadrature-phase modulated RF signal QRFMOD, which during the small signal polar modulation mode is a quadrature-phase small signal polar modulated RF signal, based on the phase-modulated quadrature-phase RF carrier signal.

In an alternate embodiment of the quadrature-phase path 34, during the small signal polar modulation mode, the quadrature-phase path 34 is disabled. As a result, the quadrature-phase modulated RF signal QRFMOD is not active. Further, during the small signal polar modulation mode, at least part of the quadrature-phase path 34 may be powered down.

In one embodiment of the RF combiner 36, during the standard modulation mode, the RF combiner 36 receives the in-phase modulated RF signal IRFMOD, which during the standard modulation mode is an in-phase standard modulated RF signal, and receives the quadrature-phase modulated RF signal QRFMOD, which during the standard modulation mode is a quadrature-phase standard modulated RF signal. During the standard modulation mode, the RF combiner 36 approximately phase-aligns and combines the in-phase standard modulated RF signal and the quadrature-phase standard modulated RF signal to provide the modulated RF signal RFMOD, which during the standard modulation mode is the standard modulated RF signal. During the small signal polar modulation mode, the RF combiner 36 receives the in-phase modulated RF signal IRFMOD, which during the small signal polar modulation mode is an in-phase small signal polar modulated RF signal, and receives the quadrature-phase modulated RF signal QRFMOD, which during the small signal polar modulation mode is a quadrature-phase small signal polar modulated RF signal. During the small signal polar modulation mode, the RF combiner 36 approximately phase-aligns and combines the in-phase small signal polar modulated RF signal and the quadrature-phase small signal polar modulated RF signal to provide the modulated RF signal RFMOD, which during the small signal polar modulation mode is the small signal polar modulated RF signal.

In an alternate embodiment of the RF combiner 36, during the small signal polar modulation mode, the in-phase path 32 is disabled. As a result, the in-phase modulated RF signal IRFMOD is not active. Therefore, during the small signal polar modulation mode, the RF combiner 36 uses the quadrature-phase modulated RF signal QRFMOD, which during the small signal polar modulation mode is the quadrature-phase small signal polar modulated RF signal, to provide the modulated RF signal RFMOD, which during the small signal polar modulation mode is the small signal polar modulated RF signal.

In an additional embodiment of the RF combiner 36, during the small signal polar modulation mode, the quadrature-phase path 34 is disabled. As a result, the quadrature-phase modulated RF signal QRFMOD is not active. Therefore, during the small signal polar modulation mode, the RF combiner 36 uses the in-phase modulated RF signal IRFMOD, which during the small signal polar modulation mode is the in-phase small signal polar modulated RF signal, to provide the modulated RF signal RFMOD, which during the small signal polar modulation mode is the small signal polar modulated RF signal.

Figure 5:
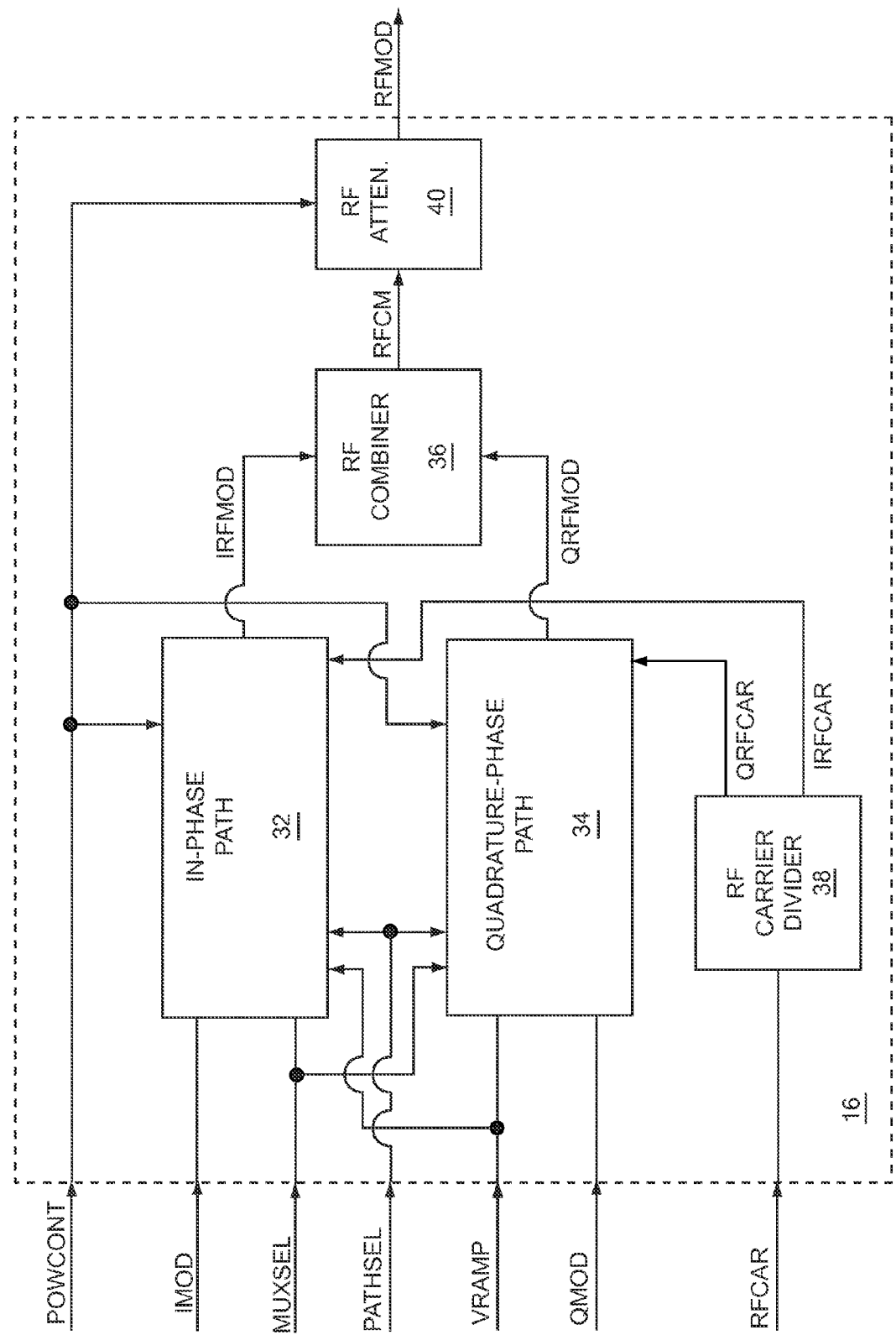
FIG. 5 shows details of the IQ modulator illustrated in FIG. 1 according to an alternate embodiment of the IQ modulator.

FIG. 5 shows details of the IQ modulator 16 illustrated in FIG. 1 according to an alternate embodiment of the IQ modulator 16. The IQ modulator 16 illustrated in FIG. 5 is similar to the IQ modulator 16 illustrated in FIG. 4, except the IQ modulator 16 illustrated in FIG. 5 includes an RF attenuator 40 coupled to an output of the RF combiner 36. As such, the RF combiner 36 provides a combined modulated RF signal RFCM to the RF attenuator 40, which provides the modulated RF signal RFMOD. The in-phase path 32, the quadrature-phase path 34, and the RF attenuator 40 receive the transmit power control signal POWCONT, which may be used to control an output power level of the RF transmit signal RFTX by controlling an amplitude of the modulated RF signal RFMOD. Specifically the RF attenuator 40 may attenuate the combined modulated RF signal RFCM to provide the modulated RF signal RFMOD based on the transmit power control signal POWCONT.

Figure 6:
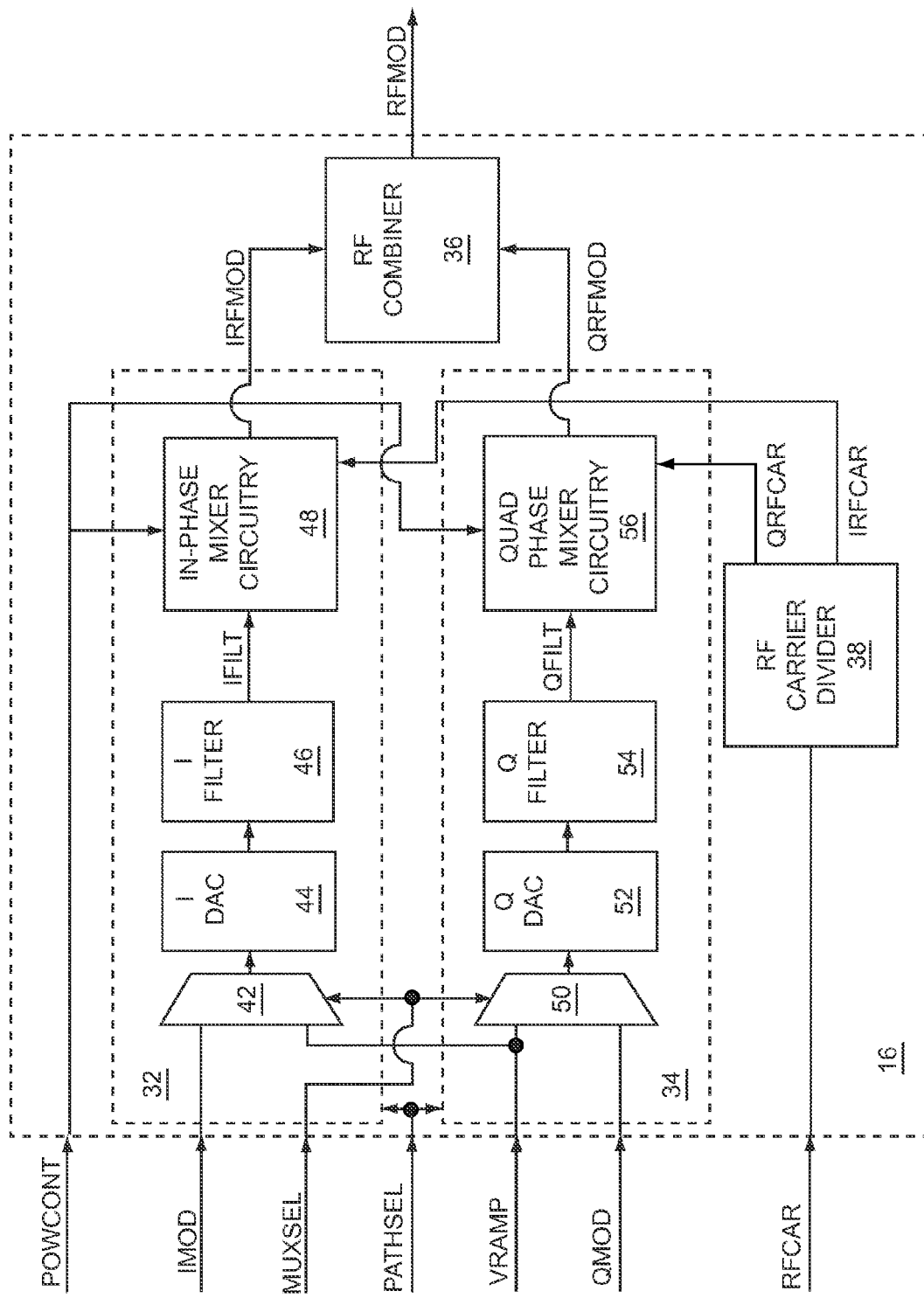
FIG. 6 shows details of an in-phase path and a quadrature-phase path illustrated in FIG. 4 according to one embodiment of the in-phase path and the quadrature-phase path.

FIG. 6 shows details of the in-phase path 32 and the quadrature-phase path 34 illustrated in FIG. 4 according to one embodiment of the in-phase path 32 and the quadrature-phase path 34. The in-phase path 32 includes an in-phase multiplexer 42, an in-phase DAC 44, an in-phase bandpass filter 46, and in-phase mixer circuitry 48 coupled in series. The quadrature-phase path 34 includes a quadrature-phase multiplexer 50, a quadrature-phase DAC 52, a quadrature-phase bandpass filter 54, and a quadrature-phase mixer circuitry 56 coupled in series.

The in-phase multiplexer 42 receives the in-phase modulation signal IMOD, the transmit power ramp signal VRAMP, and the multiplexer select signal MUXSEL. The in-phase multiplexer 42 forwards either the transmit power ramp signal VRAMP or the in-phase modulation signal IMOD to the in-phase DAC 44 based on the multiplexer select signal MUXSEL. The in-phase DAC 44 performs a digital-to-analog conversion to feed the in-phase bandpass filter 46, which filters the analog signal to provide an in-phase filtered signal IFILT to the in-phase mixer circuitry 48.

The quadrature-phase multiplexer 50 receives the quadrature-phase modulation signal QMOD, the transmit power ramp signal VRAMP, and the multiplexer select signal MUXSEL. The quadrature-phase multiplexer 50 forwards either the transmit power ramp signal VRAMP or the quadrature-phase modulation signal QMOD to the quadrature-phase DAC 52 based on the multiplexer select signal MUXSEL. The quadrature-phase DAC 52 performs a digital-to-analog conversion to feed the quadrature-phase bandpass filter 54, which filters the analog signal to provide a quadrature-phase filtered signal QFILT to the quadrature-phase mixer circuitry 56.

The in-phase mixer circuitry 48 and the quadrature-phase mixer circuitry 56 receive the transmit power control signal POWCONT. The in-phase mixer circuitry 48 receives and mixes the in-phase RF carrier signal IRFCAR and the in-phase filtered signal IFILT to provide the in-phase modulated RF signal IRFMOD. The quadrature-phase mixer circuitry 56 receives and mixes the quadrature-phase RF carrier signal QRFCAR and the quadrature-phase filtered signal QFILT to provide the quadrature-phase modulated RF signal QRFMOD.

Figure 7:
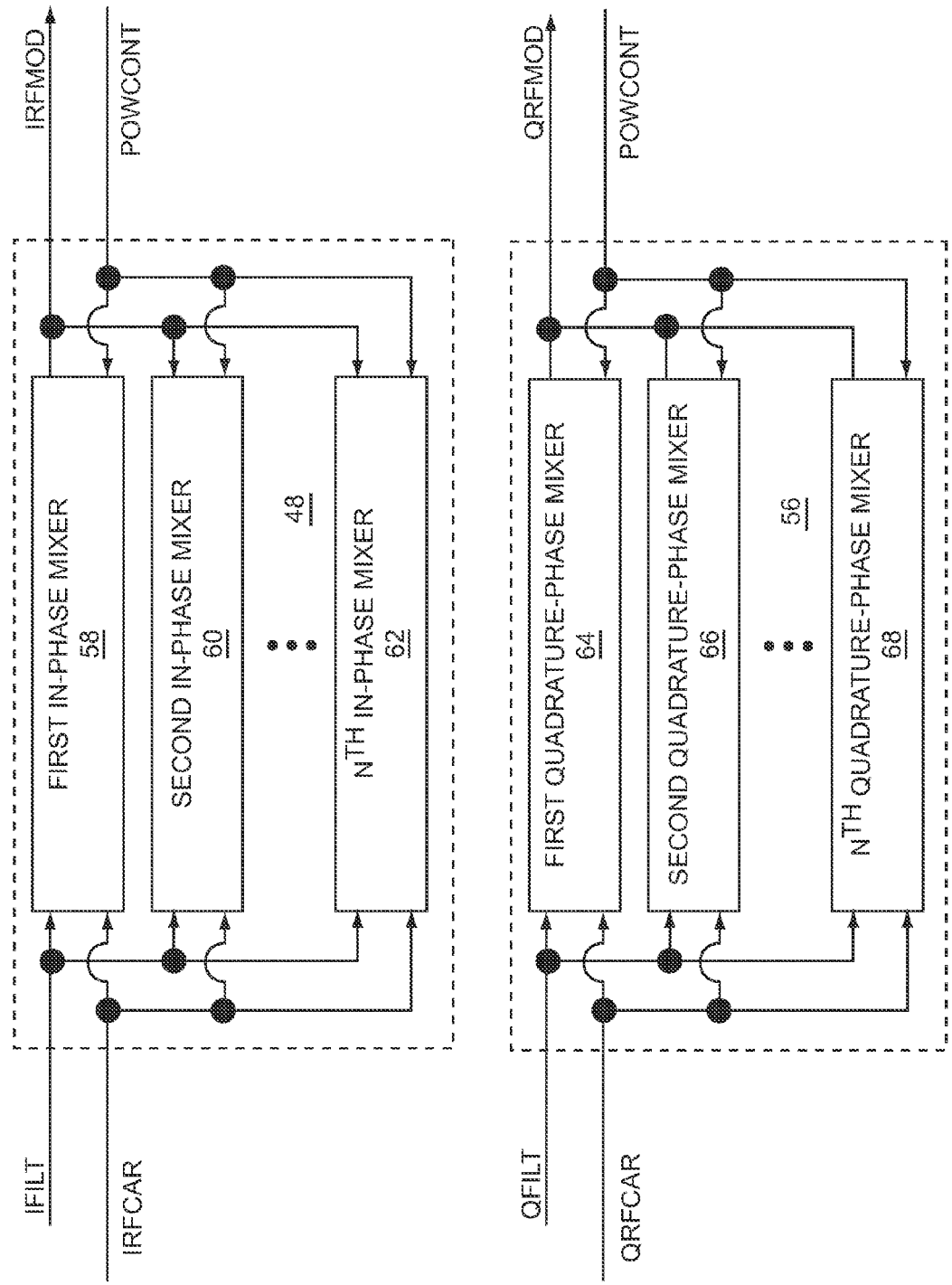
FIG. 7 shows details of in-phase mixer circuitry and quadrature-phase mixer circuitry illustrated in FIG. 6 according to one embodiment of the in-phase mixer circuitry and the quadrature-phase mixer circuitry.

FIG. 7 shows details of the in-phase mixer circuitry 48 and the quadrature-phase mixer circuitry 56 illustrated in FIG. 6 according to one embodiment of the in-phase mixer circuitry 48 and the quadrature-phase mixer circuitry 56. The in-phase mixer circuitry 48 includes a first in-phase mixer 58, a second in-phase mixer 60, and up to and including an $N^{TH}$ in-phase mixer 62 coupled in parallel. Each of the in-phase mixers 58, 60, 62 may receive and mix the in-phase filtered signal IFILT and the in-phase RF carrier signal IRFCAR to provide the in-phase modulated RF signal IRFMOD. Further, each of the in-phase mixers 58, 60, 62 may receive the transmit power control signal POWCONT, which may be used to control an output power level of the RF transmit signal RFTX. As such, a number of the in-phase mixers 58, 60, 62 that are enabled during the standard modulation mode may be based on a desired output power from the RF power amplifier circuitry 28.

The quadrature-phase mixer circuitry 56 includes a first quadrature-phase mixer 64, a second quadrature-phase mixer 66, and up to and including an $N^{TH}$ quadrature-phase mixer 68 coupled in parallel. Each of the quadrature-phase mixers 64, 66, 68 may receive and mix the quadrature-phase filtered signal QFILT and the quadrature-phase RF carrier signal QRFCAR to provide the quadrature-phase modulated RF signal QRFMOD. Further, each of the quadrature-phase mixers 64, 66, 68 may receive the transmit power control signal POWCONT, which may be used to control an output power level of the RF transmit signal RFTX. As such, a number of the quadrature-phase mixers 64, 66, 68 that are enabled during the standard modulation mode may be based on a desired output power from the RF power amplifier circuitry 28.

Figure 8:
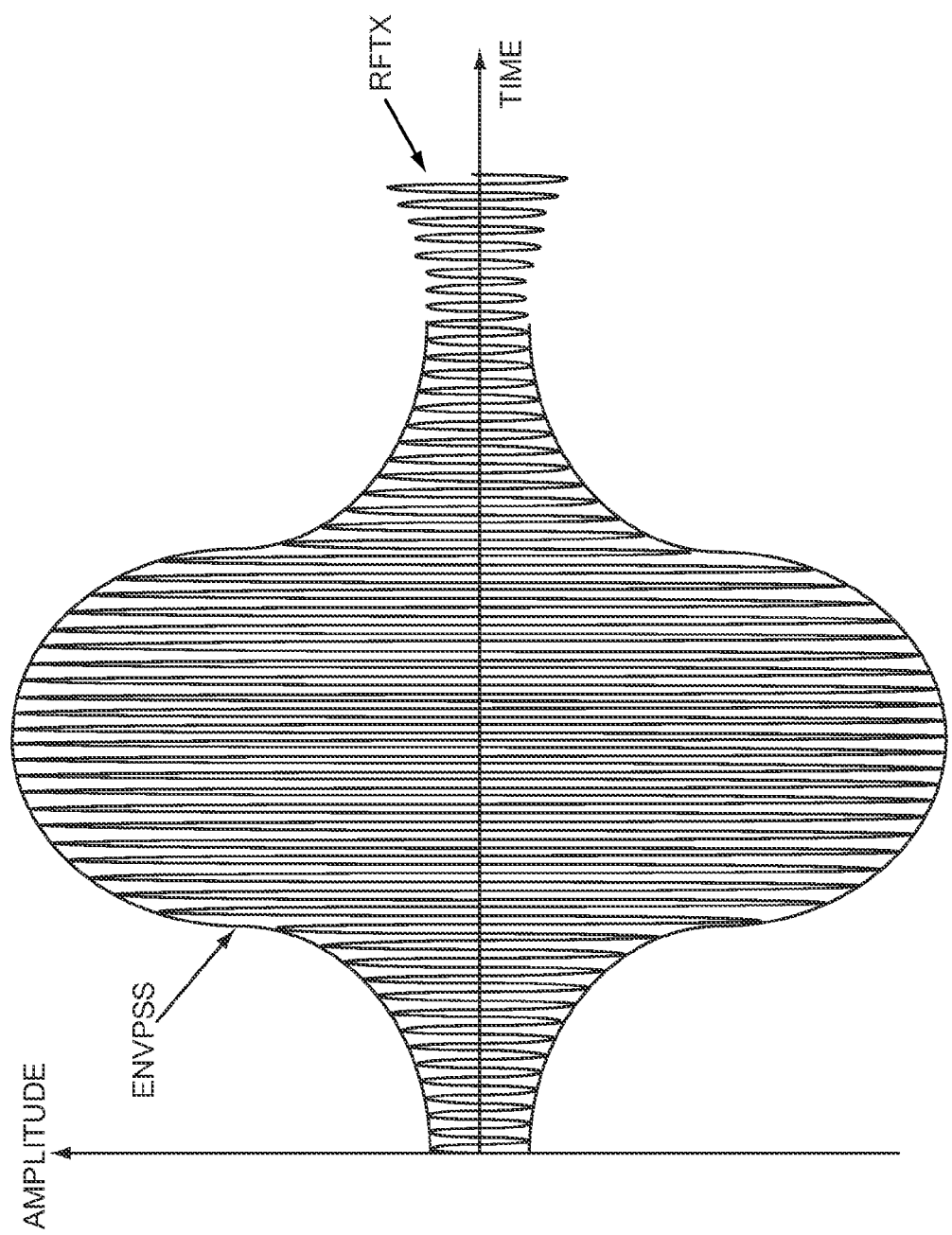
FIG. 8 is a graph showing an RF transmit signal and an envelope power supply signal illustrated in FIG. 1 according to one embodiment of the RF transmit signal and the envelope power supply signal.

FIG. 8 is a graph showing the RF transmit signal RFTX and the envelope power supply signal ENVPSS illustrated in FIG. 1 in which both the RF transmit signal RFTX and the envelope power supply signal ENVPSS are amplitude modulated, according to one embodiment of the RF transmit signal RFTX and the envelope power supply signal ENVPSS.

Figure 9:
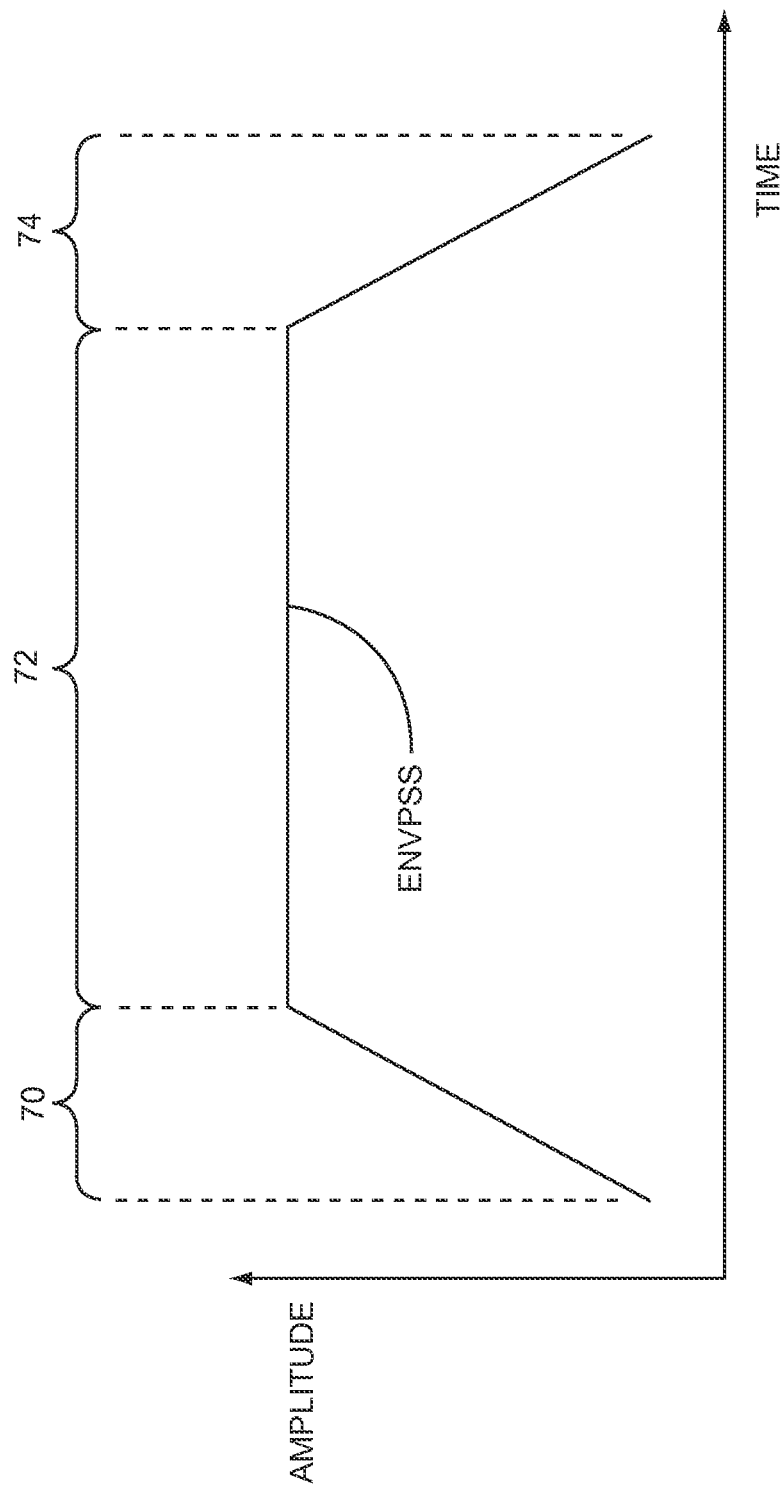
FIG. 9 is a graph showing the envelope power supply signal illustrated in FIG. 1 according to an alternate embodiment of the envelope power supply signal.

FIG. 9 is a graph showing the envelope power supply signal ENVPSS illustrated in FIG. 1 tracking an amplitude ramp profile, which has a ramp-up phase 70, a data burst phase 72, and a ramp-down phase 74 according to an alternate embodiment of the envelope power supply signal ENVPSS. The envelope power supply signal ENVPSS is not amplitude modulated and the RF transmit signal RFTX (not shown) may or may not be amplitude modulated.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. Multi-mode radio frequency (RF) circuitry comprising:
control circuitry adapted to select between a standard modulation mode and a small signal polar modulation mode;
a frequency synthesizer adapted to:
during the standard modulation mode, provide an unmodulated RF carrier signal; and
during the small signal polar modulation mode, provide a phase-modulated RF carrier signal;
an IQ modulator adapted to:
during the standard modulation mode:
receive an in-phase modulation signal and a quadrature-phase modulation signal, such that the in-phase modulation signal and the quadrature-phase modulation signal comprise phase information; and receive and phase-modulate the un-modulated RF carrier signal using the phase information to provide a standard modulated RF signal; and during the small signal polar modulation mode:
receive at least one of the in-phase modulation signal and the quadrature-phase modulation signal, such that the at least one of the in-phase modulation signal and the quadrature-phase modulation signal comprises amplitude information; and receive the phase-modulated RF carrier signal and use the amplitude information to provide a small signal polar modulated RF signal.

2. The multi-mode RF circuitry of claim 1 wherein:
during the standard modulation mode, RF power amplifier circuitry is adapted to receive and amplify the standard modulated RF signal to provide an RF transmit signal; and during the small signal polar modulation mode, the RF power amplifier circuitry is adapted to receive and amplify the small signal polar modulated RF signal to provide the RF transmit signal.

3. The multi-mode RF circuitry of claim 2 further comprising the RF power amplifier circuitry.

4. The multi-mode RF circuitry of claim 2 wherein the small signal polar modulated RF signal is one selected from a group consisting of an enhanced data rates for global system for mobile communications evolution (EDGE) transmit signal and an EDGE evolution transmit signal.

5. The multi-mode RF circuitry of claim 2 wherein during the standard modulation mode:
the in-phase modulation signal and the quadrature-phase modulation signal further comprise amplitude information; and the IQ modulator is further adapted to amplitude-modulate the un-modulated RF carrier signal using the amplitude information to provide the standard modulated RF signal, wherein the RF transmit signal is amplitude and phase modulated.

6. The multi-mode RF circuitry of claim 5 wherein during the standard modulation mode, a direct current (DC)-DC converter provides an envelope power supply signal, which provides power for amplification, to the RF power amplifier circuitry, such that the envelope power supply signal tracks the modulated RF signal.

7. The multi-mode RF circuitry of claim 6 further comprising the DC-DC converter and the RF power amplifier circuitry.

8. The multi-mode RF circuitry of claim 5 wherein during the standard modulation mode, a direct current (DC)-DC converter provides an envelope power supply signal, which provides power for amplification, to the RF power amplifier circuitry, such that the envelope power supply signal is not amplitude modulated and the RF transmit signal is amplitude and phase modulated.

9. The multi-mode RF circuitry of claim 2 wherein during the small signal polar modulation mode, the IQ modulator is further adapted to amplitude-modulate the phase-modulated RF carrier signal using the amplitude information to provide the small signal polar modulated RF signal, such that the RF transmit signal is polar modulated and neither the in-phase modulation signal nor the quadrature-phase modulation signal includes phase modulation information.

10. The multi-mode RF circuitry of claim 9 wherein during the small signal polar modulation mode, a direct current (DC)-DC converter provides an envelope power supply signal, which provides power for amplification, to the RF power amplifier, such that the envelope power supply signal tracks the modulated RF signal and the RF transmit signal is amplitude and phase modulated.

11. The multi-mode RF circuitry of claim 9 wherein during the small signal polar modulation mode, a direct current (DC)-DC converter provides an envelope power supply signal, which provides power for amplification, to the RF power amplifier, such that the envelope power supply signal is not amplitude modulated and the RF transmit signal is amplitude and phase modulated.

12. The multi-mode RF circuitry of claim 2 wherein during the small signal polar modulation mode, the small signal polar modulated RF signal is not amplitude modulated, the RF transmit signal is not amplitude modulated, and neither the in-phase modulation signal nor the quadrature-phase modulation signal includes phase modulation information.

13. The multi-mode RF circuitry of claim 12 wherein during the small signal polar modulation mode, the RF transmit signal is a Gaussian Minimum Shift Keying (GMSK) RF transmit signal.

14. The multi-mode RF circuitry of claim 12 wherein during the small signal polar modulation mode, a direct current (DC)-DC converter provides an envelope power supply signal, which provides power for amplification, to the RF power amplifier circuitry, such that the envelope power supply signal is not amplitude modulated.

15. The multi-mode RF circuitry of claim 14 wherein during the small signal polar modulation mode, the amplitude information and the envelope power supply signal both track an amplitude ramp profile.

16. The multi-mode RF circuitry of claim 14 wherein during the small signal polar modulation mode, the amplitude information tracks an amplitude ramp profile and the envelope power supply signal does not track the amplitude ramp profile.

17. The multi-mode RF circuitry of claim 2 wherein the IQ modulator comprises:
an RF carrier divider adapted to:
during the standard modulation mode, receive and divide the un-modulated RF carrier signal to provide an un-modulated in-phase RF carrier signal and an un-modulated quadrature-phase RF carrier signal, such that the un-modulated quadrature-phase RF carrier signal is phase-shifted from the un-modulated in-phase RF carrier signal by about 90 degrees; and during the small signal polar modulation mode, receive and divide the phase-modulated RF carrier signal to provide a phase-modulated in-phase RF carrier signal and a phase-modulated quadrature-phase RF carrier signal, such that the phase-modulated quadrature-phase RF carrier signal is phase-shifted from the phase-modulated in-phase RF carrier signal by about 90 degrees;

an in-phase path adapted to:
during the standard modulation mode:
receive the in-phase modulation signal and the un-modulated in-phase RF carrier signal; and
phase and amplitude-modulate the un-modulated in-phase RF carrier signal using the phase information to provide an in-phase standard modulated RF signal; and during the small signal polar modulation mode:
receive the in-phase modulation signal and the phase-modulated in-phase RF carrier signal; and
use the amplitude information to provide an in-phase small signal polar modulated RF signal based on the phase-modulated in-phase RF carrier signal;

a quadrature-phase path adapted to:
  during the standard modulation mode:
    receive the quadrature-phase modulation signal and the un-modulated quadrature-phase RF carrier signal; and
    phase and amplitude-modulate the un-modulated quadrature-phase RF carrier signal using the phase information to provide a quadrature-phase standard modulated RF signal; and
  during the small signal polar modulation mode:
    receive the quadrature-phase modulation signal and the phase-modulated quadrature-phase RF carrier signal; and
    use the amplitude information to provide a quadrature-phase small signal polar modulated RF signal based on the phase-modulated quadrature-phase RF carrier signal; and
an RF combiner adapted to:
  during the standard modulation mode, approximately phase-align and combine the in-phase standard modulated RF signal and the quadrature-phase standard modulated RF signal to provide the standard modulated RF signal; and
  during the small signal polar modulation mode, approximately phase-align and combine the in-phase small signal polar modulated RF signal and the quadrature-phase small signal polar modulated RF signal to provide the small signal polar modulated RF signal.

18. The multi-mode RF circuitry of claim 17 wherein:
the in-phase path comprises an in-phase multiplexer, an in-phase digital-to-analog converter (DAC), an in-phase bandpass filter, and in-phase mixer circuitry coupled in series; and
the quadrature-phase path comprises a quadrature-phase multiplexer, a quadrature-phase DAC, a quadrature-phase bandpass filter, and quadrature-phase mixer circuitry coupled in series.

19. The multi-mode RF circuitry of claim 18 wherein:
the in-phase mixer circuitry comprises a plurality of in-phase mixers coupled in parallel, such that a number of the plurality of in-phase mixers that are enabled during the standard modulation mode is based on a desired output power from the RF power amplifier circuitry; and
the quadrature-phase mixer circuitry comprises a plurality of quadrature-phase mixers coupled in parallel, such that a number of the plurality of quadrature-phase mixers that are enabled during the standard modulation mode is based on a desired output power from the RF power amplifier circuitry.

20. The multi-mode RF circuitry of claim 2 wherein the IQ modulator comprises:
an RF carrier divider adapted to:
  during the standard modulation mode, receive and divide the un-modulated RF carrier signal to provide an un-modulated in-phase RF carrier signal and an un-modulated quadrature-phase RF carrier signal, such that the un-modulated quadrature-phase RF carrier signal is phase-shifted from the un-modulated in-phase RF carrier signal by about 90 degrees; and
  during the small signal polar modulation mode, receive and divide the phase-modulated RF carrier signal to provide a phase-modulated in-phase RF carrier signal;
an in-phase path adapted to:
  during the standard modulation mode:
    receive the in-phase modulation signal and the un-modulated in-phase RF carrier signal; and
    phase and amplitude-modulate the un-modulated in-phase RF carrier signal using the phase information to provide an in-phase standard modulated RF signal; and
  during the small signal polar modulation mode:
    receive the in-phase modulation signal and the phase-modulated in-phase RF carrier signal; and
    use the amplitude information to provide an in-phase small signal polar modulated RF signal;
a quadrature-phase path adapted to:
  during the standard modulation mode:
    receive the quadrature-phase modulation signal and the un-modulated quadrature-phase RF carrier signal; and
    phase and amplitude-modulate the un-modulated quadrature-phase RF carrier signal using the phase information to provide a quadrature-phase standard modulated RF signal; and
  during the small signal polar modulation mode, the quadrature-phase path is disabled; and
an RF combiner adapted to:
  during the standard modulation mode, approximately phase-align and combine the in-phase standard modulated RF signal and the quadrature-phase standard modulated RF signal to provide the standard modulated RF signal; and
  during the small signal polar modulation mode, use the in-phase small signal polar modulated RF signal to provide the small signal polar modulated RF signal.

21. The multi-mode RF circuitry of claim 20 wherein during the small signal polar modulation mode, at least part of the quadrature-phase path is powered down.

22. The multi-mode RF circuitry of claim 2 wherein the IQ modulator comprises:
an RF carrier divider adapted to:
  during the standard modulation mode, receive and divide the un-modulated RF carrier signal to provide an un-modulated in-phase RF carrier signal and an un-modulated quadrature-phase RF carrier signal, such that the un-modulated quadrature-phase RF carrier signal is phase-shifted from the un-modulated in-phase RF carrier signal by about 90 degrees; and
  during the small signal polar modulation mode, receive and divide the phase-modulated RF carrier signal to provide a phase-modulated quadrature-phase RF carrier signal;
an in-phase path adapted to:
  during the standard modulation mode:
    receive the in-phase modulation signal and the un-modulated in-phase RF carrier signal; and
    phase and amplitude-modulate the un-modulated in-phase RF carrier signal using the phase information to provide an in-phase standard modulated RF signal; and
  during the small signal polar modulation mode, the in-phase path is disabled;
a quadrature-phase path adapted to:
  during the standard modulation mode:
    receive the quadrature-phase modulation signal and the un-modulated quadrature-phase RF carrier signal; and
    phase and amplitude-modulate the un-modulated quadrature-phase RF carrier signal using the phase information to provide a quadrature-phase standard modulated RF signal; and
  during the small signal polar modulation mode:

receive the quadrature-phase modulation signal and the phase-modulated quadrature-phase RF carrier signal; and use the amplitude information to provide a quadrature-phase small signal polar modulated RF signal; and an RF combiner adapted to:

during the standard modulation mode, approximately phase-align and combine the in-phase standard modulated RF signal and the quadrature-phase standard modulated RF signal to provide the standard modulated RF signal; and during the small signal polar modulation mode, use the quadrature-phase small signal polar modulated RF signal to provide the small signal polar modulated RF signal.

23. The multi-mode RF circuitry of claim 22 wherein during the small signal polar modulation mode, at least part of the in-phase path is powered down.

24. A method comprising:

selecting between a standard modulation mode and a small signal polar modulation mode;

during the standard modulation mode, providing an un-modulated RF carrier signal;

during the small signal polar modulation mode, providing a phase-modulated RF carrier signal;

during the standard modulation mode, receiving an in-phase modulation signal and a quadrature-phase modulation signal, such that the in-phase modulation signal and the quadrature-phase modulation signal comprise phase and amplitude information;

during the standard modulation mode, receiving and phase and amplitude-modulating the un-modulated RF carrier signal using the phase and amplitude information to provide a standard modulated RF signal;

during the small signal polar modulation mode, receiving at least one of the in-phase modulation signal and the quadrature-phase modulation signal, such that the at least one of the in-phase modulation signal and the quadrature-phase modulation signal comprises amplitude information; and during the small signal polar modulation mode, receiving the phase-modulated RF carrier signal and using the amplitude information to provide a small signal polar modulated RF signal.

* * * * *